(12) United States Patent
Nam et al.

(10) Patent No.: US 10,242,774 B2
(45) Date of Patent: Mar. 26, 2019

(54) CHIP RESISTANCE ELEMENT AND CHIP RESISTANCE ELEMENT ASSEMBLY

(71) Applicant: SAMSUNG ELECTRO-MECHANICS CO., LTD., Suwon-si, Gyeonggi-do (KR)

(72) Inventors: Jung Min Nam, Suwon-si (KR); Doo Ho Yoo, Suwon-si (KR); Young Key Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/835,291

(22) Filed: Dec. 7, 2017

(65) Prior Publication Data

US 2018/0315524 A1    Nov. 1, 2018

(30) Foreign Application Priority Data

Apr. 27, 2017  (KR) .................... 10-2017-0054378
Jun. 12, 2017  (KR) .................... 10-2017-0073326

(51) Int. Cl.
| H01C 1/148 | (2006.01) |
| H01C 1/01 | (2006.01) |
| H05K 1/16 | (2006.01) |
| H01C 1/142 | (2006.01) |
| H01C 7/00 | (2006.01) |

(52) U.S. Cl.
CPC .............. *H01C 1/148* (2013.01); *H01C 1/01* (2013.01); *H01C 1/142* (2013.01); *H05K 1/167* (2013.01); *H01C 7/00* (2013.01)

(58) Field of Classification Search
CPC .......... H01C 1/148; H01C 1/01; H01C 1/142; H01C 7/00
See application file for complete search history.

(56) References Cited

U.S. PATENT DOCUMENTS 3,876,912 A * 4/1975 Sanders ................. H01C 13/02
                                                                       338/309
4,272,739 A * 6/1981 Nesses .................... H01P 1/227
                                                                         333/81 A (Continued)

FOREIGN PATENT DOCUMENTS

JP     2004-03180 A    1/2004
JP     4047760 B2      2/2008

(Continued)

*Primary Examiner* — Kyung S Lee
(74) *Attorney, Agent, or Firm* — Morgan, Lewis & Bockius LLP

(57) ABSTRACT

A chip resistance element includes a base substrate having a first surface and a second surface opposing each other, two sides connecting the first surface and the second surface to each other, and two end surfaces connecting the first surface and the second surface to each other; a resistive layer disposed on the second surface; and a first terminal, a second terminal, and a third terminal disposed to be respectively connected to the resistive layer and to be separated from each other on the second surface. The third terminal having a second surface portion disposed between the first terminal and the second terminal on the second surface and a side portion connected to and disposed on one of the two sides of the base substrate.

15 Claims, 4 Drawing Sheets

(56) References Cited

U.S. PATENT DOCUMENTS

| | | | | |
|---|---|---|---|---|
| 4,927,697 A * | 5/1990 | Hill | ............... | H05K 3/305 |
| | | | | 156/252 |
| 5,170,146 A * | 12/1992 | Gardner | ............... | H01C 17/006 |
| | | | | 338/272 |
| 5,179,366 A * | 1/1993 | Wagner | ............... | H01C 1/084 |
| | | | | 338/308 |
| 5,339,065 A * | 8/1994 | Slenker | ............... | H01C 10/30 |
| | | | | 333/81 A |
| 6,097,276 A * | 8/2000 | Van Den Broek | ....... | H01C 7/06 |
| | | | | 338/22 R |
| 6,856,234 B2 * | 2/2005 | Kuriyama | ............... | H01C 1/142 |
| | | | | 338/309 |
| 8,098,127 B2 * | 1/2012 | Tchaplia | ............... | H01P 5/16 |
| | | | | 338/254 |
| 8,284,016 B2 * | 10/2012 | Ryu | ............... | H01C 1/034 |
| | | | | 338/307 |
| 2004/0252009 A1 | 12/2004 | Tsukada | | |
| 2010/0225439 A1 * | 9/2010 | Han | ............... | H01C 1/012 |
| | | | | 338/309 |
| 2016/0125981 A1 | 5/2016 | Kim et al. | | |
| 2016/0172083 A1 | 6/2016 | Kim et al. | | |
| 2017/0011856 A1 | 1/2017 | Hattori et al. | | |

FOREIGN PATENT DOCUMENTS

| | | |
|---|---|---|
| KR | 10-2016-0052283 A | 5/2016 |
| KR | 10-2016-0072550 A | 6/2016 |
| KR | 10-2017-0007161 A | 1/2017 |

\* cited by examiner

CHIP RESISTANCE ELEMENT AND CHIP RESISTANCE ELEMENT ASSEMBLY

CROSS-REFERENCE TO RELATED APPLICATIONS

This application claims the benefit under 35 U.S.C. § 119(a) of priority to Korean Patent Application Nos. 10-2017-0054378 filed on Apr. 27, 2017 and 10-2017-0073326 filed on Jun. 12, 2017 in the Korean Intellectual Property Office (KIPO), the entire disclosures of which are incorporated herein by reference for all purposes.

BACKGROUND

1. Field

The present disclosure following description relates to a chip resistance element and a chip resistance element assembly having the chip resistance element.

2. Description of Related Art

A resistance element having a chip shape may be suitable for implementing a precise resistor, and may serve to adjust a current and to drop a voltage within a circuit.

In addition, in a case in which a printed circuit board is designed and platformized, so that electronic components may be exchanged, removed, or added, according to specifications of various devices, on a single printed circuit board, the resistance element may also be used to connect patterns on the printed circuit board to each other so as to be suitable for a designed circuit.

In addition, the resistance element may connect the pattern of the printed circuit board to a power source or a ground and may be used as a pull-up resistor or a pull-down resistor.

However, in a case in which a plurality of resistance elements are used to design the circuit satisfying the specification of the electronic device, there is a problem that a mounting area for the plurality of resistance elements on the printed circuit board is necessarily increased.

In particular, in accordance with a trend in which the miniaturization and refinement of electronic devices are required, it is not preferable that the mounting area occupied by the resistance element on the printed circuit board be increased.

SUMMARY

An aspect of the present disclosure may provide a chip resistance element capable of having excellent efficiency of a mounting area on a circuit board and being stably connected to the circuit board.

According to an aspect of the present disclosure, a chip resistance element may include a base substrate having a first surface and a second surface opposing each other, two sides connecting the first surface and the second surface to each other, and two end surfaces connecting the first surface and the second surface to each other; a resistive layer disposed on the second surface; and a first terminal, a second terminal, and a third terminal disposed to be respectively connected to the resistive layer and to be separated from each other on the second surface, wherein the third terminal having a second surface portion disposed between the first terminal and the second terminal on the second surface and a side portion connected to and disposed on one of the two sides of the base substrate.

According to another aspect of the present disclosure, a chip resistance element assembly may include a circuit board having a plurality of electrode pads; and a chip resistance element disposed on the circuit board and electrically connected to the plurality of electrode pads, wherein the chip resistance element includes a base substrate having a first surface and a second surface opposing each other, two sides connecting the first surface and the second surface to each other, and two end surfaces connecting the first surface and the second surface to each other, a resistive layer disposed on the second surface, and a first terminal, a second terminal, and a third terminal disposed to be respectively connected to the resistive layer and to be separated from each other on the second surface, wherein the third terminal having a second surface portion disposed between the first terminal and the second terminal on the second surface and a side portion connected to and disposed on one of the two sides of the base substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
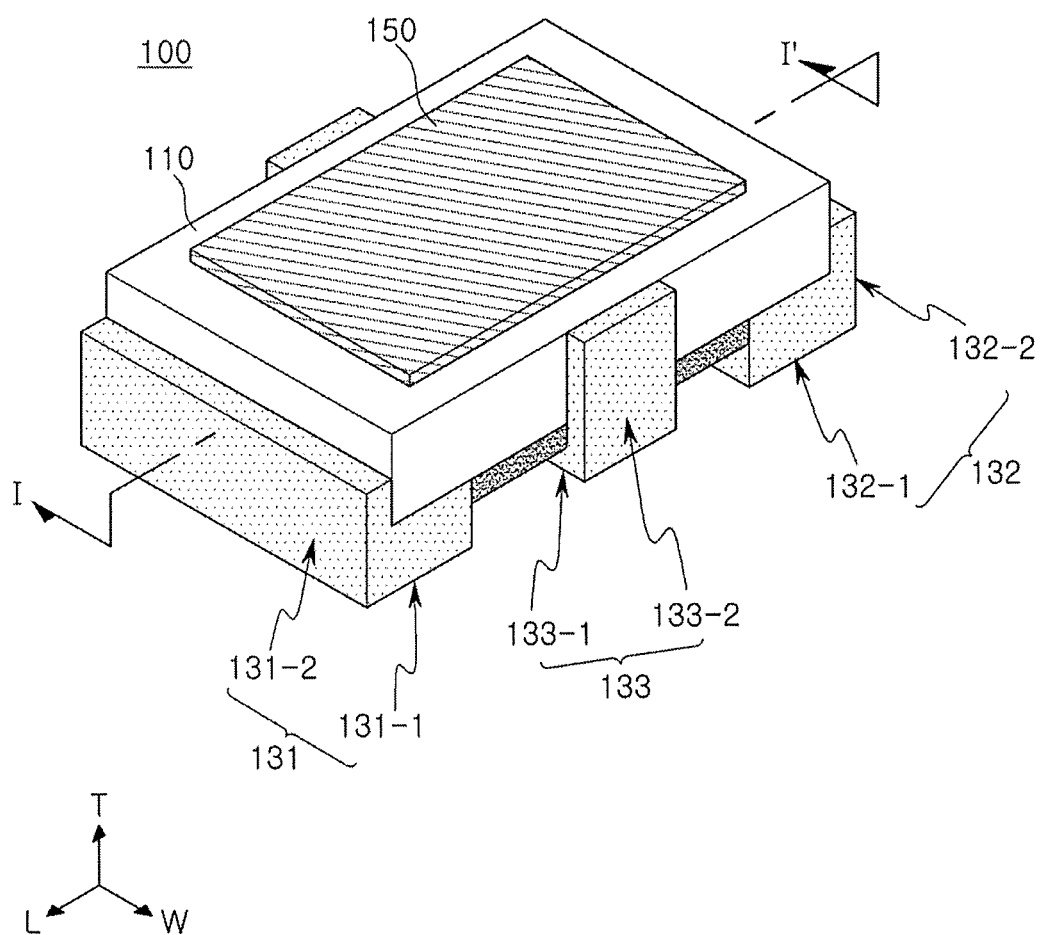
FIG. 1 shows a perspective view illustrating a chip resistance element according to an exemplary embodiment in the present disclosure.
Figure 2:
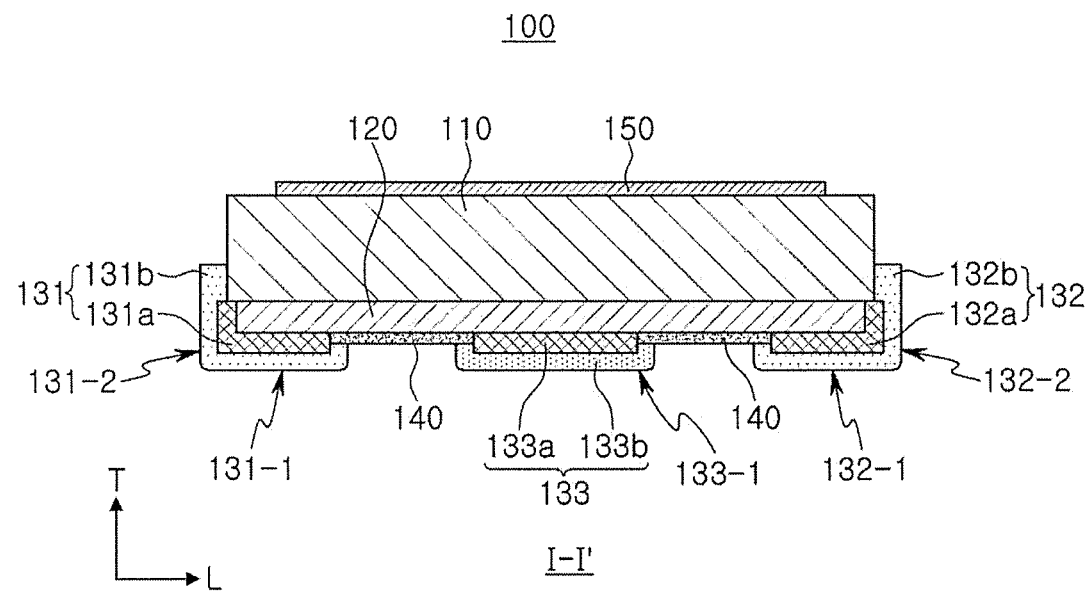
FIG. 2 shows an example of a cross-sectional view taken along a line I-I' of the chip resistance element illustrated in FIG. 1.
Figure 3:
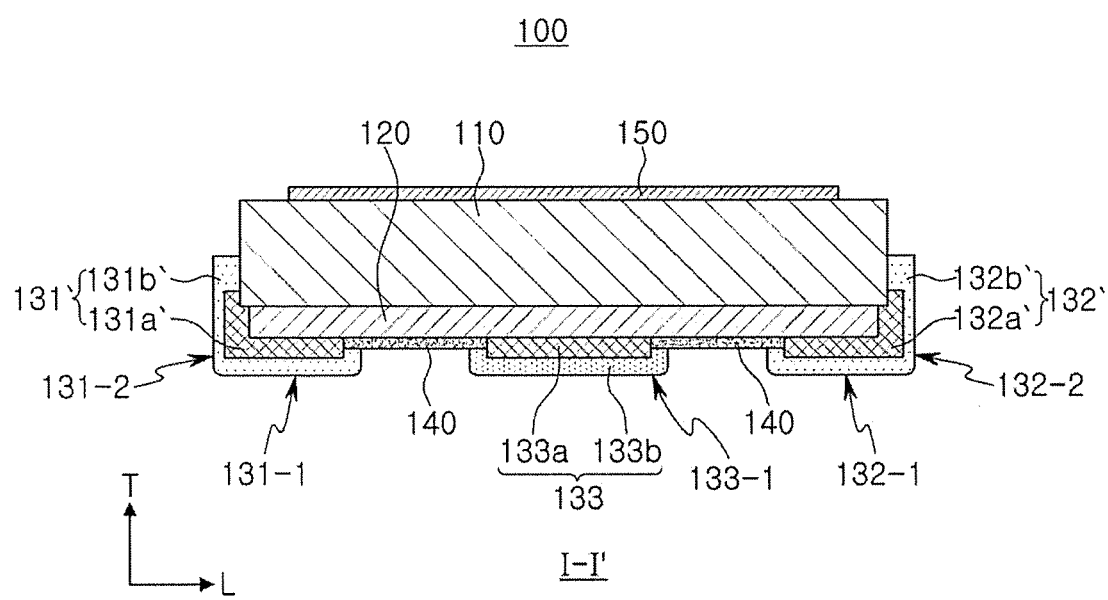
FIG. 3 shows another example of the cross-sectional view taken along the line I-I' of the chip resistance element illustrated in FIG. 1.

FIG. 1 shows a perspective view illustrating a chip resistance element according to an exemplary embodiment in the present disclosure, FIG. 2 shows an example of a cross-sectional view taken along a line I-I' of the chip resistance element illustrated in FIG. 1, and FIG. 3 shows another example of the cross-sectional view taken along the line I-I' of the chip resistance element illustrated in FIG. 1.

Referring to FIGS. 1 and 2, a chip resistance element 100 according to an exemplary embodiment in the present disclosure may include abase substrate 110, a resistive layer 120, and first, second, and third terminals 131, 132, and 133. In addition, the chip resistance element 100 may further include a first protective layer 140 and a second protective layer 150.

The base substrate 110 is to support the resistive layer 120 and to secure rigidity of the resistance element 100 and is not particularly limited. As the base substrate 110, for example, an insulating substrate, or the like may be used, and the base substrate 110 may be formed of an alumina material of which a surface is anodized and insulated.

In addition, the base substrate 110 may have a predetermined thickness, may be formed in a thin plate shape of which a shape of one surface is a rectangular shape, and may have first and second major surfaces opposing each other, two end surfaces opposing each other, and two sides opposing each other.

For example, as illustrated in FIGS. 1 and 2, the first surface and the second surface may be each a top surface and a bottom surface of the base substrate 110 opposing each other in a thickness direction T of the base substrate 110. In addition, the two end surfaces may be two surfaces of the base substrate 110 opposing each other in a length direction L of the base substrate 110, and the two sides may be two surfaces of the base substrate 110 opposing each other in a width direction W of the base substrate 110.

In addition, as the base substrate 110 is formed of a material having excellent thermal conductivity, the base substrate 110 may serve as a heat diffusion passage for dissipating heat generated in the resistive layer 120 when the resistance element is used to the outside.

The resistive layer 120 may be disposed on the second surface of the base substrate 110. In addition, the resistive layer 120 may be connected to the first, second, and third terminals 131, 132, and 133 which are spaced apart from each other and may be used as two resistance factors between the first, second, and third terminals 131, 132, and 133. In addition, unlike the present exemplary embodiment, the resistive layer 120 may be provided as the two resistance factors which are separated from each other.

For example, the resistive layer 120 may have a resistance value determined by trimming. Here, trimming refers to an operation such as a cutting for finely adjusting the resistance value, and the like, and may be an operation of determining the resistance value which is set in each resistance part at the time of designing a circuit.

As the resistive layer 120, various metals or alloys, or a compound such as oxide may be used, but the resistive layer 120 is not limited thereto. For example, the resistive layer 120 may include at least one of a Cu—Ni based alloy, a Ni—Cr based alloy, Ru oxide, Si oxide, manganese (Mn), and a Mn based alloy.

The first terminal 131 and the second terminal 132 may be each disposed to be connected to the resistive layer 120 and to be separated from each other on the second surface of the base substrate 110.

For example, the first terminal 131 and the second terminal 132 may include portions 131-1 and 132-1 disposed at opposite sides of a bottom surface of the base substrate 110 and portions 131-2 and 132-2 extended to the end surfaces of the base substrate 110 along L direction, as illustrated in FIGS. 1 and 2. In such a form, the first terminal 131 and the second terminal 132 may each cover one end portion and the other end portion of the resistive layer 120. In addition, the first terminal 131 and the second terminal 132 may be respectively extended to the end surfaces of the base substrate 110 and may cover corners at which the bottom surface and the end surfaces of the base substrate 110 meet. The first terminal 131 and the second terminal 132 may contact the end surfaces of the base substrate 110.

The third terminal 133 may be disposed between the first terminal 131 and the second terminal 132 and may be connected to the resistive layer 120. In addition, the third terminal 133 may include a second surface terminal 133-1, which is a portion disposed on the second surface of the base substrate 110, and a side terminal 133-2, which is a portion disposed on the side of the base substrate 110.

As illustrated in FIGS. 1 and 2, the third terminal 133 may be disposed on the bottom surface (i.e. the second surface) of the base substrate 110 and may be extended to the side surface connecting the top surface and the bottom surface of the base substrate 110 with each other. In addition, the side portion may be extended to a corner at which the first surface (i.e. the top surface) and the side surface of the base substrate 110 meet.

Specifically, the first, second, and third terminals 131, 132, and 133 may respectively include first, second, and third electrode layers 131a, 132a, and 133a disposed on the resistive layer 120, and may respectively include first, second, and third plated layers 131b, 132b, and 133b disposed on the first, second, and third electrode layers 131a, 132a, and 133a.

For example, as illustrated in FIG. 2, the first terminal 131 may include the first electrode layer 131a and the first plated layer 131b, the second terminal 132 may include the second electrode layer 132a and the second plated layer 132b, and the third terminal 133 may include the third electrode layer 133a and the third plated layer 133b.

The first, second, and third electrode layers 131a, 132a, and 133a may be disposed on one surface of the resistive layer 120 to be spaced apart from each other, and the third electrode layer 133a may be disposed between the first electrode layer 131a and the second electrode layer 132a. In addition, the first, second, and third electrode layers 131a, 132a, and 133a may be respectively connected to the resistive layer 120. In addition, the first electrode layer 131a and the second electrode layer 133a may be disposed to cover opposite sides of the resistive layer 120.

The first, second, and third electrode layers 131a, 132a, and 133a may be formed by a method for coating a conductive paste for forming conductive electrodes on the resistive layer 120, but is not limited thereto, and as the coating method, a method such as a screen printing method, or the like may be used.

In addition, the first, second, and third electrode layers 131a, 132a, and 133a may serve as a seed of a plating operation for forming the first, second, and third plated layers 131b, 132b, and 133b.

The first, second, and third electrode layers 131a, 132a, and 133a may be formed of a conductive paste of a material different from the resistive layer 120 described above, and may also use the same component as the resistive layer 120.

Referring to FIG. 3, first and second electrode layers 131a' and 132a' may cover opposite sides of the resistive layer 120 and may cover a corner at which the bottom surface and the end surface of the base substrate 110 are in contact with each other. Therefore, first and second terminals 131' and 132', including first and second plated layers 131b' and 132b', may be formed to be higher along the end surface of the base substrate 110 in relation to the bottom surface (i.e. the second surface) of the base substrate 110 so that the first electrode layer 131a and the second electrode layer 132a may contact the end surfaces of the base substrate 110.

Meanwhile, as described above, the third terminal 133 may include the second surface terminal 133-1 and the side terminal 133-2, and the second surface terminal 133-1 and the side terminal 133-2 may be formed of the third electrode layer 133a and the third plated layer 133b.

In addition, a portion of the third electrode layer 133a may be formed through a deposition operation. Specifically, the portion of the third electrode layer 133a disposed on the side of the base substrate 110 to form the side terminal 133-2 may be formed through the deposition operation with respect to the side of the base substrate 110.

As such, the third terminal 133 may include the third electrode layer 133*a* disposed on the side of the base substrate 110 as well as on the second surface of the base substrate 110.

Therefore, the third terminal 133 may be formed to be higher than the first terminal 131 and the second terminal 132 along the side of the base substrate 110 in relation to the bottom surface of the base substrate 110, thereby securing a bonding area with a solder on the side of the base substrate 110.

A so-called solder in excess phenomenon may occur, which is a problem in which the solder is formed at an unnecessary portion around an electrode pad due to excessive solder during a soldering operation. A solder ball formed by such the solder in excess may cause short-circuit between the electrode pads, causing malfunctioning and overcurrent.

The chip resistance element according to an exemplary embodiment may prevent such a solder in excess phenomenon, and may have sufficient adhesion strength between the electrode pad disposed on the circuit board and the third terminal.

Table 1 below illustrates data of an experimental example that tests whether or not a mounted state of the resistance element is suitable, depending on the presence or absence of the side terminal.

a surface of the resistive layer 120 on which the first, second, and third electrode layers 131*a*, 132*a*, and 133*a* are not disposed.

The first protective layer 140 may be formed of a silicon (SiO$_2$) or glass material, but is not limited thereto, and may be formed on the resistive layer 120 and the base substrate 110 by an over-coating.

In a specific example, the first protective layer 140 may include an internal protective layer formed of glass and an external protective layer formed of polymer. As needed, the internal protective layer may be formed before a trimming operation to prevent an occurrence of cracks in the resistive layer 120 during the trimming operation, and the external protective layer may be formed after the trimming operation to protect the resistive layer 120.

Meanwhile, even though the first protective layer 140 is disposed on the resistive layer 120 and the base substrate 110, the first, second, and third terminals 131, 132, and 133 may protrude further than the first protective layer 140, such that the first, second, and third terminals 131, 132, and 133 and the electrode pads disposed on the board may easily be in contact with each other when the first, second, and third terminals 131, 132, and 133 are mounted on the board.

In addition, the second protective layer 150 may be disposed on the first surface of the base substrate 110. The second protective layer 150 may protect the chip resistance

TABLE 1

| | | Presence or Absence of Side Terminal | | | | | | | | | |
|---|---|---|---|---|---|---|---|---|---|---|---|
| | | Absence of Side Terminal | | | | | Presence of Side Terminal | | | | |
| PSR between Electrode Pads | | Once | 2 times | 3 times | 4 times | 5 times | Once | 2 times | 3 times | 4 times | 5 times |
| Absence of PSR | Number of Samples [ea] | 1000 | 1000 | 1000 | 1000 | 1000 | 1000 | 1000 | 1000 | 1000 | 1000 |
| | Number of NG [ea] | 0 | 0 | 1 | 1 | 0 | 0 | 0 | 0 | 0 | 0 |
| | Defect Rate [%] | 0.00% | 0.00% | 0.10% | 0.10% | 0.00% | 0.00% | 0.00% | 0.00% | 0.00% | 0.00% |
| Presence of PSR | Number of Samples [ea] | 1000 | 1000 | 1000 | 1000 | 1000 | 1000 | 1000 | 1000 | 1000 | 1000 |
| | Number of NG [ea] | 436 | 518 | 635 | 428 | 521 | 0 | 0 | 0 | 0 | 0 |
| | Defect Rate [%] | 43.6% | 51.8% | 63.5% | 42.8% | 52.1% | 0.0% | 0.0% | 0.0% | 0.0% | 0.0% |

The experimental example illustrates a result determined as a defect (NG) in a case in which the chip resistance element in which the third terminal 133 includes the side terminal 133-2 and the chip resistance element in which the third terminal 133 does not include the side terminal 133-2 are mounted on the electrode pad of the printed circuit board by 1000 per unit (Lot, times) through a reflow operation, and the solder in excess phenomenon or a cold solder joint phenomenon occurs.

Referring to Table 1, in a case in which the chip resistance element which does not include the side terminal is mounted on the printed circuit board, it may be confirmed that the defect occurs. In particular, in a case in which the chip resistance element which does not include the side terminal is mounted on the printed circuit board that a photo imageable solder resist (PSR) ink is coated between the electrode pads to which the first, second, and third terminals 131, 132, and 133 are bonded by the solder, a defect rate may be significantly high.

The chip resistance element according to an exemplary embodiment may not cause the defect occurring from the chip resistance element which does not include the side terminal.

In addition, a first protective layer 140 for protecting the resistive layer 120 from external impact may be disposed on element 100 from external impacts. For example, the second protective layer 150 may have a predetermined height to prevent impacts from an upper portion of the chip resistance element 100 from being applied to the side terminal 133-2 of the third terminal.

In addition, the second protective layer 150 may be formed by a method of coating an insulating material, and as the coating method, a screen printing method, or the like may be used.

Figure 4:
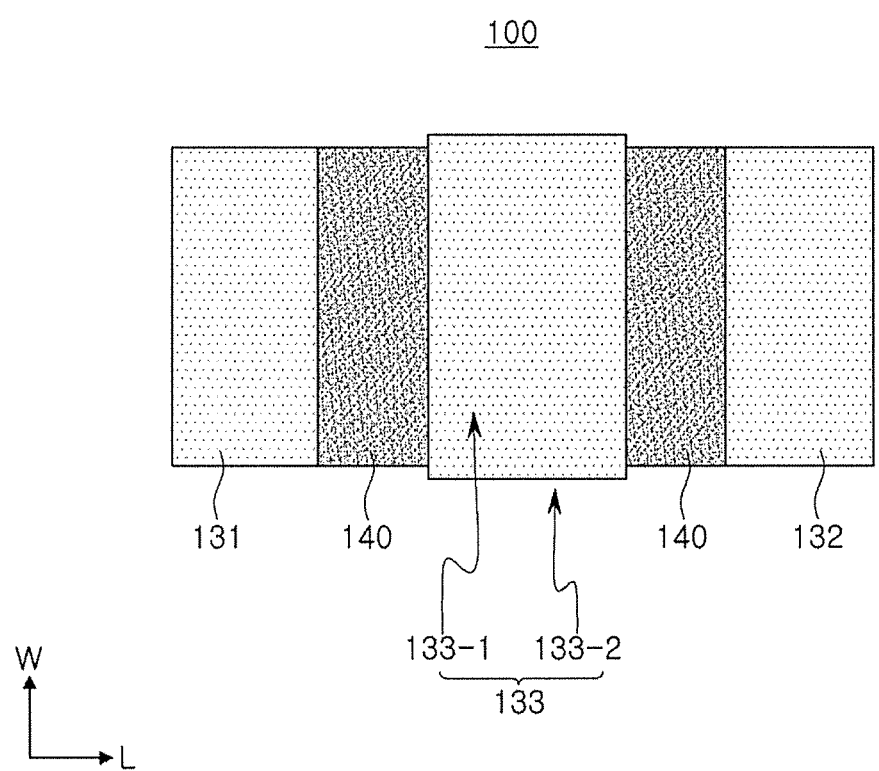
FIG. 4 shows a bottom view of the chip resistance element illustrated in FIG. 1.

FIG. 4 shows a bottom view of the chip resistance element illustrated in FIG. 1.

Referring to FIG. 4, the chip resistance element may include the first, second, and third terminals 131, 132, and 133. In addition, the chip resistance element may include the first protective layer 140.

Here, since the third terminal 133 includes the portion 133-2 extended to the side of the base substrate 110 as well as the portion 133-1 disposed between the first terminal 131 and the second terminal 132, a contact area with the solder may be secure and a stable connection with the circuit board may be guaranteed during the reflow operation. The portion 133-1 may be formed to have a greater width than the first and second terminals 131 and 132. Also the portion 133-1 may be formed to be wider than the resistive layer 120. The first and second terminals 131 and 132 may be formed to have the same width as the resistive layer 120.

Figure 5:
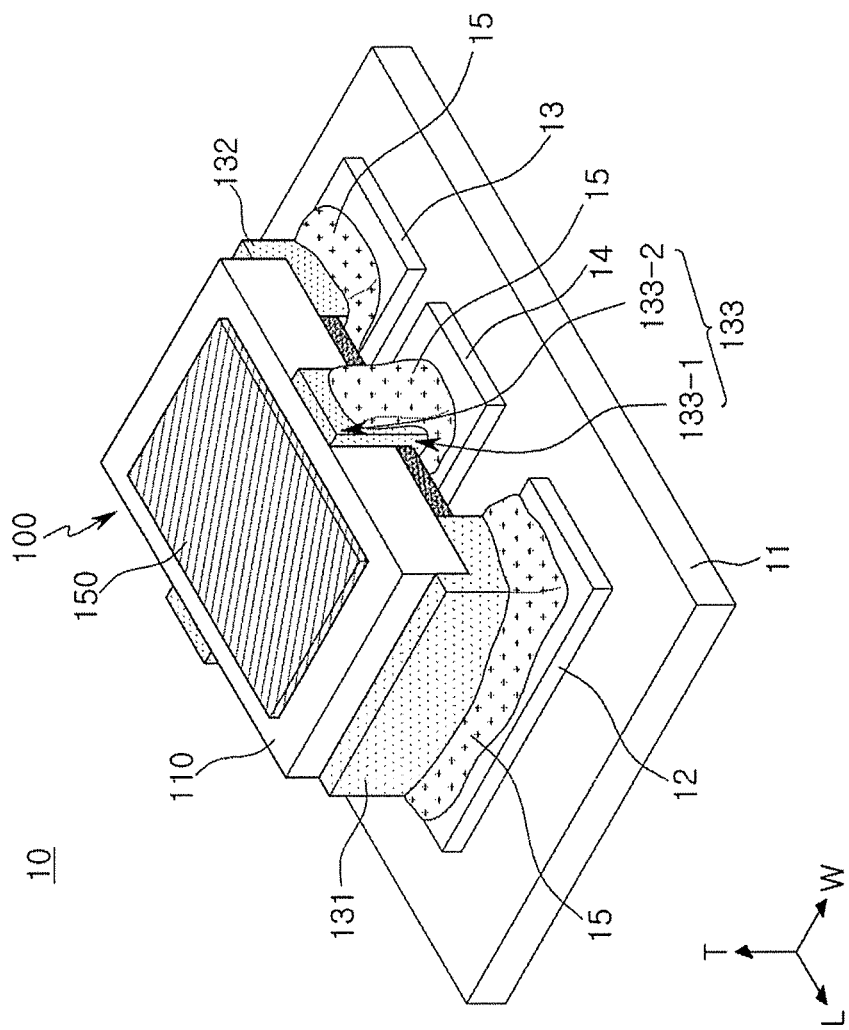
FIG. 5 shows a perspective view illustrating a chip resistance element assembly according to an exemplary embodiment in the present disclosure.

FIG. 5 shows a perspective view illustrating a chip resistance element assembly according to an exemplary embodiment in the present disclosure.

Referring to FIG. 5, a chip resistance element assembly according to an exemplary embodiment in the present disclosure may include a plurality of electrode pads disposed to be spaced apart from each other, and a circuit board 11 on which the chip resistance element 100 is mounted.

The chip resistance element 100 may include the base substrate 110 having the first surface and the second surface, the resistive layer disposed on the second surface of the base substrate 110, the first terminal 131 and the second terminal 132 each connected to the resistive layer and disposed to be separated from each other on the second surface, and the third terminal 133 having the second surface portion 133-1 disposed between the first terminal 131 and the second terminal 132 and the side portion 133-2 connected to the second surface portion and disposed on the side of the based substrate that connects the first surface and the second surface with each other.

In addition, the first terminal 131 and the second terminal 132 may be extended to the end surfaces opposing to each other in the length direction L of the base substrate 110, and may cover the corner at which the second surface and the end surface meet.

In addition, the side portion 133-2 may be extended to the corner at which the first surface and the side meet.

Since the chip resistance element 100 may be understood from the chip resistance element described with reference to FIGS. 1 through 4, overlapped descriptions will be omitted.

The circuit board 11, which is a portion on which an electronic circuit is formed, may have an integrated circuit IC for a specific operation and a control of an electronic device, and the like which are formed thereon, and a current supplied from a separate power supply may flow in the circuit board 10.

In this case, the circuit board 11 may include various wiring lines, or may further include various kinds of semiconductor elements such as a transistor, and the like. Further, the circuit board 11 may be variously configured as needed. For example, the circuit board 11 may include a conductive layer or include a dielectric layer.

The first, second, and third electrode pads 12, 13, and 14 may be disposed on the circuit board 11 to be spaced apart from each other, and may be respectively connected to the first, second, and third terminals 131, 132, and 133 of the resistance element 100 using a solder 15.

In FIG. 5, it was illustrated that the first electrode pad 12 is connected to the first terminal 131 and the second electrode pad 13 is connected to the second terminal 132, but the first electrode pad 12 may be connected to the second terminal 132 and the second electrode pad 13 may be connected to the first terminal 131 depending on the design.

As illustrated in FIG. 5, the third terminal 133 may include the side portion 133-2 disposed on the side of the base substrate 110, and the solder which electrically connects the third electrode pad 14 and the third terminal 133 with each other may be disposed on a surface of the side portion.

Therefore, the chip resistance element assembly 10 according to an exemplary embodiment may prevent defect occurring from solder balls and improve bonding strength between the chip resistance element 100 and the circuit board 11.

As set forth above, according to the exemplary embodiments in the present disclosure, when the chip resistance element 100 is mounted on the board 11, the chip resistance element 100 may have excellent efficiency and may be stably connected to the printed circuit board 11.

Various advantages and effects of the present disclosure are not limited to the description above, and may be more readily understood in the description of exemplary embodiments in the present disclosure.

While exemplary embodiments have been shown and described above, it will be apparent to those skilled in the art that modifications and variations could be made without departing from the scope of the present disclosure as defined by the appended claims.

What is claimed is:

1. A chip resistance element comprising:
a base substrate having
    a first surface and a second surface opposing each other in a thickness direction,
    two sides opposing each other in a width direction and connecting the first surface and the second surface to each other, and
    two end surfaces opposing each other in a length direction and connecting the first surface and the second surface to each other;
a resistive layer disposed on the second surface; and
a first terminal, a second terminal, and a third terminal disposed to be respectively connected to the resistive layer and to be separated from each other on the second surface,
wherein the first and second terminals are arranged at respective ends in the length direction on the resistive laver, and
the third terminal has
    a second surface portion disposed in a width direction across the second surface and between the first terminal and the second terminal, and
    a side portion connected to and disposed on one of the two sides of the base substrate.

2. The chip resistance element of claim 1, wherein the first terminal and the second terminal respectively cover one end portion and the other end portion of the resistive layer and is in contact with the second surface.

3. The chip resistance element of claim 1, wherein the first terminal and the second terminal are respectively extended to the end surfaces and cover corners at which the second surface and the end surfaces meet.

4. The chip resistance element of claim 1, wherein the side portion is extended to a corner at which the first surface and the side meet.

5. The chip resistance element of claim 1, further comprising a protective layer disposed on the first surface.

6. The chip resistance element of claim 1, wherein the first, second, and third terminals respectively include
    first, second, and third electrode layers, and
    first, second, and third plated layers disposed on the first, second, and third electrode layers.

7. The chip resistance element of claim 6, wherein a portion of the third electrode layer disposed on the side of the base substrate is formed in a deposition operation.

8. The chip resistance element of claim 1, wherein the first and second terminals are formed in a plating operation after a printing operation.

9. A chip resistance element assembly comprising:
a circuit board having a plurality of electrode pads; and a chip resistance element disposed on the circuit board and electrically connected to the plurality of electrode pads, wherein the chip resistance element includes a base substrate having a first surface and a second surface opposing each other in a thickness direction, two sides opposing each other in a width direction and connecting the first surface and the second surface to each other, and two end surfaces opposing each other in a length direction and connecting the first surface and the second surface to each other, a resistive layer disposed on the second surface, and a first terminal, a second terminal, and a third terminal disposed to be respectively connected to the resistive layer and to be separated from each other on the second surface, wherein the first and second terminals are arranged at respective ends in the length direction on the resistive layer, and the third terminal has a second surface portion disposed in a width direction across the second surface and between the first terminal and the second terminal, and a side portion connected to and disposed on one of the two sides of the base substrate.

10. The chip resistance element assembly of claim 9, wherein the first terminal and the second terminal respectively cover one end portion and the other end portion of the resistive layer and is in contact with the second surface.

11. The chip resistance element assembly of claim 9, wherein the first terminal and the second terminal are respectively extended to the end surfaces and cover corners at which the second surface and the end surfaces meet.

12. The chip resistance element assembly of claim 9, wherein the side portion is extended to a corner at which the first surface and the side meet.

13. The chip resistance element assembly of claim 9, further comprising a protective layer disposed on the first surface.

14. The chip resistance element assembly of claim 9, wherein the first, second, and third terminals respectively include first, second, and third electrode layers, and first, second, and third plated layers disposed on the first, second, and third electrode layers.

15. The chip resistance element assembly of claim 9, wherein a solder electrically connecting the electrode pads and the third terminal is disposed on a surface of the side portion.

* * * * *